United States Patent
Brekelmans

(10) Patent No.: US 7,176,766 B2
(45) Date of Patent: Feb. 13, 2007

(54) LC OSCILLATOR

(75) Inventor: Johannes Hubertus Antonius Brekelmans, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/528,254

(22) PCT Filed: Aug. 8, 2003

(86) PCT No.: PCT/IB03/03648

§ 371 (c)(1),
(2), (4) Date: Mar. 17, 2005

(87) PCT Pub. No.: WO2004/027978

PCT Pub. Date: Apr. 1, 2004

(65) Prior Publication Data

US 2005/0212610 A1    Sep. 29, 2005

(30) Foreign Application Priority Data

Sep. 20, 2002   (EP) .................................. 02078896

(51) Int. Cl.
*H03B 5/00* (2006.01)

(52) U.S. Cl. ............................ 331/117 FE; 331/167; 331/117 R

(58) Field of Classification Search .......... 331/117 FE, 331/167, 117 R
See application file for complete search history.

(56) References Cited

U.S. PATENT DOCUMENTS

| | | | |
|---|---|---|---|
| 6,268,778 B1 * | 7/2001 | Mucke et al. | 331/117 R |
| 6,683,509 B2 * | 1/2004 | Albon et al. | 331/177 V |
| 6,987,425 B1 * | 1/2006 | Sutardja | 331/177 R |

OTHER PUBLICATIONS

Hung C-M et al: "Fully Integrated 5.35-GHZ CMOS VCOS and Prescalers" IEEE Transactions on Microwave Theory and Techniques, IEEE Inc. New York, US, vol. 49, No. 1, Jan. 1, 2001, pp. 17-22.

* cited by examiner

*Primary Examiner*—Arnold Kinkead

(57) ABSTRACT

An LC oscillator (I) comprises a cross-coupled PMOS transistor pair (Ma, Mb) coupled to a pair of capacitors (Cva, Cvb) and a pair of inductances (La, Lb). To enhance the signal amplification of the oscillator, a pair of auxiliary transistor circuits (Qa, Qb; Na, Nb) is provided which are coupled between the drain and, preferably, the source of each PMOS transistor. The capacitors (Cva, Cvb) are preferably variable capacitors and the inductances (La, Lb) are preferably connected to ground to allow a enlarged tuning voltage range.

13 Claims, 2 Drawing Sheets

LC OSCILLATOR

Figure 1:
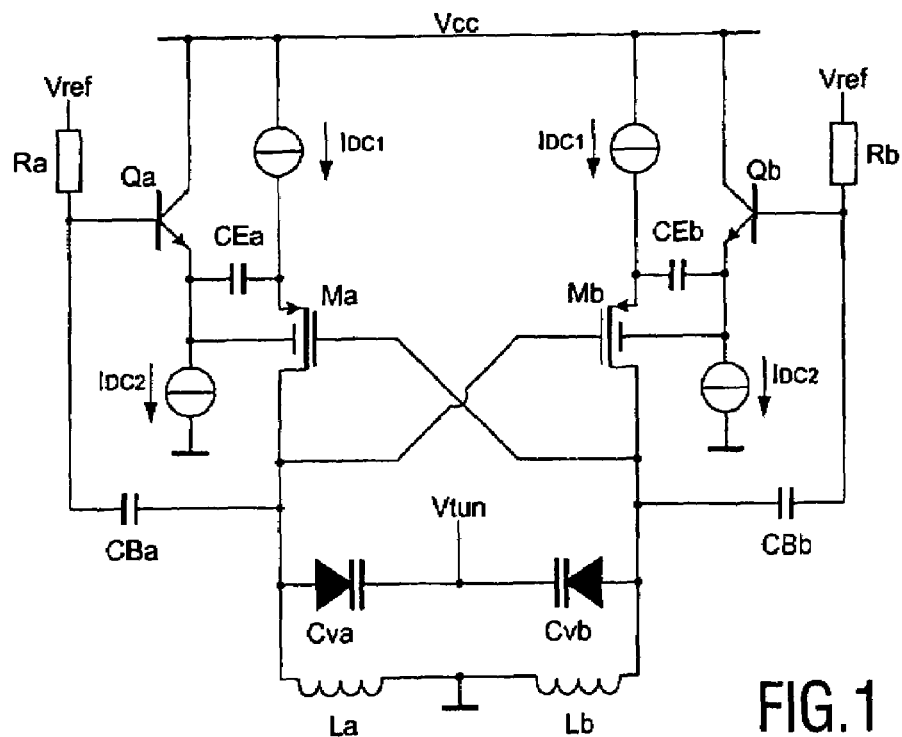

The present invention relates to an LC oscillator. More in particular, the present invention relates to an LC oscillator for producing an oscillator signal, the oscillator comprising a resonance circuit comprising a first and a second capacitor and a first and a second inductance for determining the frequency of the oscillator signal, and an active circuit comprising a first and a second PMOS transistor for amplifying the oscillator signal, the gate of each said transistor being directly coupled to the drain of the other transistor so as to provide a directly cross-coupled transistor pair, wherein the active circuit is coupled to the resonance circuit.

An oscillator of this kind defined above is disclosed in U.S. Pat. No. 6,281,758. In the oscillator of U.S. Pat. No. 6,281,758 the resonance circuit is labelled "varactor tuning circuit", the capacitors being constituted by voltage controlled capacitors, also known as varactors. The inductors and capacitors are directly coupled to the cross-coupled PMOS transistors of the active circuit. The node connecting the two inductors is connected to a buffering circuit containing an NMOS transistor which in turn is connected to ground.

In the design of LC oscillators MOS (Metal Oxide Semiconductor) transistors (also known as MOSFETs) have been preferred over bipolar transistors because of the MOS transistors' noise characteristics and smooth transition from the saturated to the linear operating region, The oscillator of U.S. Pat. No. 6,281,758 employs a pair of PMOS (p-channel MOS) transistors which introduce substantially lower flicker (1/f) noise and a better substrate isolation compared to traditionally used NMOS (n-channel MOS) transistors. It has been found, however, that for a given bias current the transconductance of the PMOS transistors is about half that of their NMOS counterparts, resulting in a lower oscillator signal gain.

It is an object of the present invention to provide an LC oscillator as defined in the preamble which has an improved oscillator signal gain while preserving the advantageous properties of the PMOS transistors.

Accordingly, an oscillator as defined above is in accordance with the present invention characterized in that the oscillator further comprises a first and a second auxiliary transistor circuit for further amplifying the oscillator signal, each said auxiliary transistor circuit having an input terminal coupled to the drain of the first and second PMOS transistor respectively.

That is, auxiliary transistor circuits are added to the LC oscillator so as to inprove its gain while leaving the basic configuration of the oscillator unaffected. In particular, the cross-coupled PMOS transistor arrangement is not altered. Instead, the auxiliary transistor circuits are substantially external to the cross-coupled PMOS transistor pair, and coupled in such as way so as to not detrimentally influence the basic noise properties of the oscillator.

In a preferred embodiment, the first and the second auxiliary transistor circuit each have an output terminal coupled to the source of the first and second PMOS transistor respectively. That is, the auxiliary transistor circuits are each coupled between the drain and the source of the PMOS transistors. Preferably, the output terminals of the first and second auxiliary transistor circuit are coupled to the sources of the PMOS transistors through coupling capacitors.

In a particularly advantageous embodiment the first and second PMOS transistor are each provided with a back gate coupled with an output terminal of a respective auxiliary transistor circuit. This provides an additional signal path which assists in the amplification of the oscillator signal.

In an alternative embodiment, the first and second auxiliary transistor circuit are each connected in series with the first and the second PMOS transistor respectively. That is, they are preferably directly coupled to the sources of the respective PMOS transistors.

Although it is preferred that the output terminals of the auxiliary transistor circuits are coupled to the (sources of the) PMOS transistors, it can be envisaged that the first and the second auxiliary transistor circuit each have an output terminal coupled to the resonance circuit.

The first and the second auxiliary transistor circuit may each comprise a bipolar transistor, a MOS transistor, or both. Preferably, such a MOS transistor is an NMOS transistor.

Preferably, the first and/or the second capacitor is a variable capacitor. This allows the oscillator frequency to be tuned. It is, however, also possible to use capacitors having a fixed value.

According to an important further aspect of the present invention it is preferred that the resonance circuit is directly coupled to ground. This is particularly advantageous in embodiments in which the resonance circuit contains variable capacitors. Such capacitors require a tuning voltage which can be varied over a much wider range when the resonance circuit is coupled to ground than otherwise would be the case. Thus a wider frequency tuning range is obtained. In addition, the (anode) terminals of the variable capacitors are thus provided with a direct DC coupling to ground, resulting in a tuning voltage having a very low noise and hence an oscillator signal having a high spectral purity.

Coupling the resonance circuit directly to ground may also be effected in non-tuneable LC oscillators, that is, oscillators having fixed capacitor values.

The present invention further provides an integrated circuit comprising an LC oscillator as defined above, as well as a device comprising an LC oscillator as defined above. The oscillator of the present invention is particularly suitable for applications where a relatively low supply voltage is used. Exemplary devices in which the oscillator of the present invention can be advantageously used are, but are not limited to, television tuners, channel converters and similar telecommunications devices.

The present invention will further be explained below with reference to exemplary embodiments illustrated in the accompanying drawings, in which:

FIG. 1 schematically shows a first embodiment of an oscillator according to the present invention.

Figure 2:
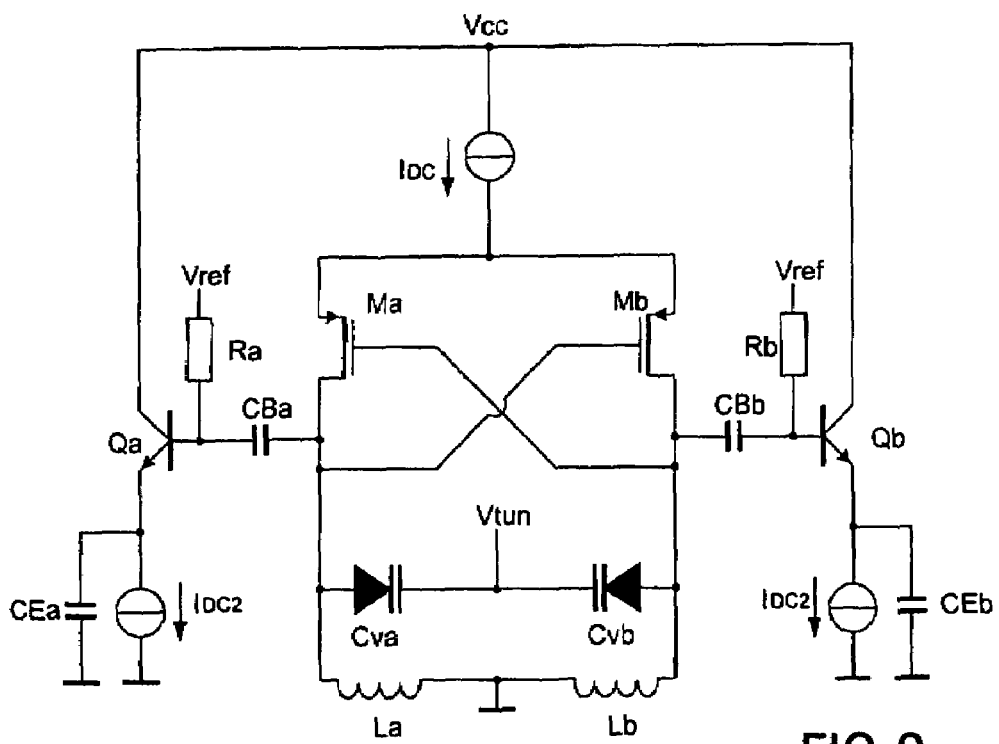

FIG. 2 schematically shows a second embodiment of an oscillator according to the present invention.

Figure 3:
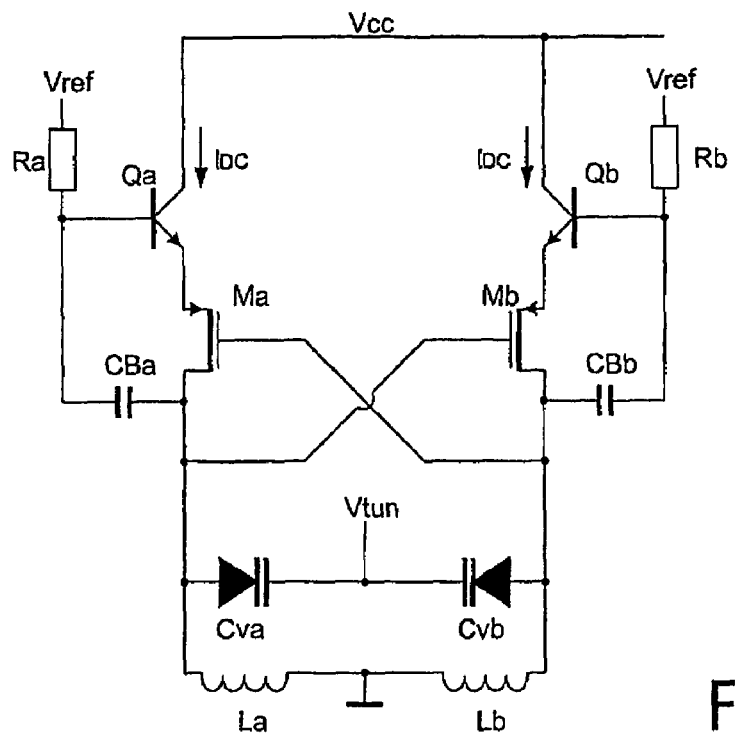

FIG. 3 schematically shows a third embodiment of an oscillator according to the present invention.

Figure 4:
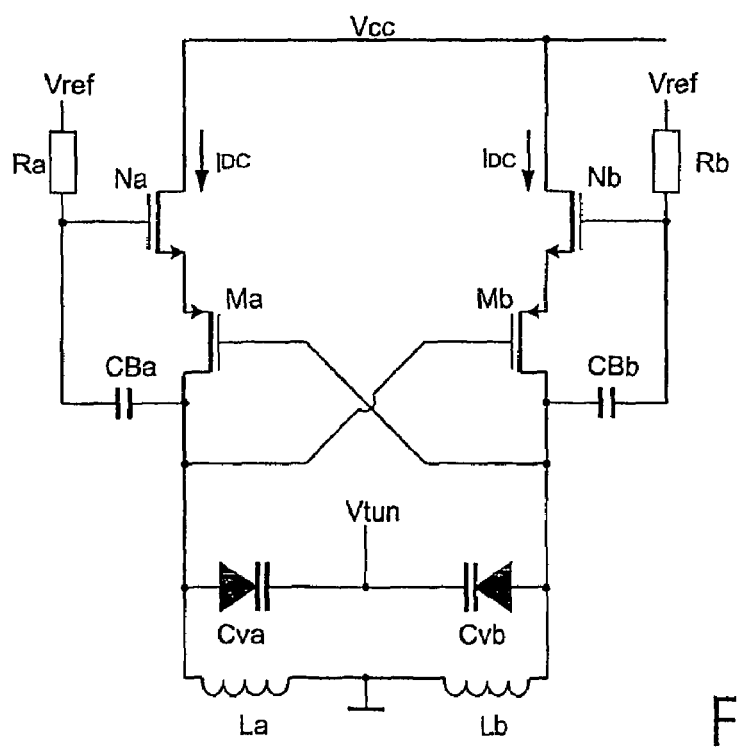

FIG. 4 schematically shows a fourth embodiment of an oscillator according to the present invention.

The oscillator 1 shown merely by way of non-limiting example in FIG. 1 comprises a resonance circuit, an active circuit, and two auxiliary transistor circuits. The resonance circuit (which may also be referred to as tank circuit) comprises a first inductor La and a second inductor Lb which are connected in series, as well as a first capacitor Cva and a second capacitor Cvb which are also connected in series, parallel to the inductors so as to form a closed loop. The capacitors Cva and Cvb are variable capacitors and receive a tuning voltage Vtun at their common node. The common node of the inductors is shown to be connected to ground, as will later be explained in more detail below.

The active circuit comprises two PMOS transistors Ma and Mb which are cross-coupled, that is, the gate of transistor Mb is connected to the drain of transistor Ma, while the gate of transistor Ma is connected to the drain of transistor Mb. The drains of the first and second PMOS transistors Ma and Mb are also coupled to the first and second capacitors Cva, Cvb and first and second inductors La and Lb, respectively. The sources of the PMOS transistors Ma and Mb are connected to current sources providing (equal) bias currents.

In accordance with the present invention, the oscillator circuit 1 further comprises two auxiliary transistor circuits (or auxiliary amplification circuits) comprising transistors Qa and Qb respectively. These transistors Qa and Qb, which are shown to be bipolar npn-type transistors, each have a base which is coupled, via a coupling capacitor CBa, CBb, to the drain of the respective PMOS transistor. The node connecting the coupling capacitor CBa, CBb to the PMOS transistor Ma, Mb constitutes the input terminal of the respective auxiliary transistor circuit, while the output terminal is constituted by the node connecting a further coupling capacitor CEa, CEb to the source of the PMOS transistor Ma, Mb. This further coupling capacitor CEa, CEb is connected to the emitter of the transistor Qa, Qb, thus forming an emitter follower circuit.

Also connected to the emitter of the transistors Qa, Qb is a back gate of the PMOS transistors Ma, Mb. The back gate or "bulk connection" is a parasitic MOS transistor terminal which provides a further opportunity for signal control.

As can be seen from FIG. 1, the basic configuration of the LC oscillator 1 of FIG. 1 is identical to the one known from the Prior Art. However, the auxiliary transistor circuits comprising transistors Qa and Qb provide additional gain. This additional gain is achieved without affecting the excellent noise characteristics of the basic oscillator circuit.

As stated above, the resonance circuit (Cva, Cvb, La, Lb) of the embodiment of FIG. 1 is directly connected to ground. This allows the tuning voltage Vtun fed to the variable capacitors (varactors) Cva, Cvb to range from the supply voltage Vcc to a minimum voltage of about 0.3 V necessary to bias the varactors. This tuning range is substantially larger than in Prior Art LC oscillators where the resonance circuit is typically at a voltage ranging between the supply voltage and ground. Means to artificially connect anode terminals of the variable capacitors to ground using AC coupling have a detrimental effect on spectral purity and on the frequency tuning range. As a result, the oscillator of the present invention has a substantially larger tuning range.

In the example shown the auxiliary transistor circuits each comprise a single bipolar transistor. It is, however, possible to use a MOS transistor instead of the bipolar transistor, or to use multiple transistors in each auxiliary transistor circuit.

Although the preferred embodiment of the oscillator 1 of the present invention is shown in FIG. 1, alternative embodiments are possible. One such alternative embodiment is shown in FIG. 2. This embodiment is similar to the one shown in FIG. 1. However, the output terminals of the auxiliary transistor circuits are not connected to the sources of the PMOS transistors but are instead connected to ground. The sources of the PMOS transistors are mutually connected since no feedback loop between the sources and the drains is available via the auxiliary transistor circuits. The two bipolar transistors independently add to the overall amplification, contributing in the same manner as the well known Collpits oscillator. Similar to the embodiment of FIG. 1, the back gates of the PMOS transistors can advantageously be connected to the respective emitters of the bipolar transistors (not shown).

In the embodiment of FIG. 3 the auxiliary transistors Qa, Qb are arranged in series with the PMOS transistors Ma, Mb: the emitters of Qa, Qb are connected to the sources of Ma, Mb. This embodiment has the advantage of requiring fewer components and, by sharing bias currents ($I_{DC}$), being more power efficient.

The embodiment of FIG. 4 is substantially identical to that of FIG. 3, with the exception of the bipolar transistors Qa, Qb which have been replaced with NMOS transistors Na, Nb.

As will be clear from the above description, the present invention is based upon the insight that the advantageous noise properties of PMOS transistors should be preserved while providing an LC oscillator having a higher gain. This higher gain means that the applications of the oscillator of the present invention are not restricted to resonance circuits having a high quality factor (high resonance impedance) and that resonance circuits having a lower quality factor may also be used. In addition, a greater safety margin is provided against no oscillation occurring in extreme operating conditions which may result from variations in the supply voltage, variations in temperature and parameter changes which in turn may result from variations in the manufacturing process of the integrated cicuits in which the oscillators may be embodied. The LC oscillator of the present invention keeps the basic oscillator configuration intact but adds transistors to increase the signal gain.

It is noted that in this document the word "comprising" is not meant to exclude other elements or steps, and that the use of the word "an" or "a" does not exclude a plurality. A single transistor or other circuit element may fulfill the function or functions of two of more circuit elements or means recited in the claims. In particular, the two inductances recited in the claims may be replaced by a suitable single inductance. Conversely, the single transistors Qa, Qb, Na and/or Nb shown in the drawings may each be replaced by a transistor circuit consisting of two or more transistors.

It will therefore be understood by those skilled in the art that the present invention is not limited to the embodiments illustrated above and that many modifications and additions may be made without departing from the scope of the invention as defined in the appending claims.

The invention claimed is:

1. An LC oscillator for producing an oscillator signal, the oscillator comprising:
   a resonance circuit comprising a first and a second capacitor and a first and a second inductance for determining the frequency of the oscillator signal, and
   an active circuit comprising a first and a second PMOS transistor for amplifying the oscillator signal, the gate of each said transistor being directly coupled to the drain of the other transistor so as to provide a directly cross-coupled transistor pair,
   wherein the active circuit is coupled to the resonance circuit, characterized in that the oscillator further comprises a first and a second auxiliary transistor circuit for further amplifying the oscillator signal, each said auxiliary transistor circuit having an input terminal capacitively coupled to the drain of the first and second PMOS transistor respectively.

2. An LC oscillator according to claim 1, wherein the first and the second auxiliary transistor circuits each have an output terminal coupled to the source of the first and second PMOS transistor respectively.

3. An LC oscillator according to claim 2, wherein the output terminals of the first and second auxiliary transistor circuit are coupled to the sources of the PMOS transistors through coupling capacitors.

4. An LC oscillator according to claim 3, wherein the first and second PMOS transistor are each provided with a controllable back gate coupled with an output terminal of a respective auxiliary transistor circuit.

5. An LC oscillator according to claim 3, wherein the first and second auxiliary transistor circuit are connected in series with the first and the second PMOS transistor respectively.

6. An LC oscillator according to claim 1, wherein the first and the second auxiliary transistor circuits each have an output terminal coupled to the resonance circuit.

7. An LC oscillator according to claim 1, wherein the first and the second auxiliary transistor circuit comprise a bipolar transistor.

8. An LC oscillator according to claim 1, wherein the first and the second auxiliary transistor circuit comprise a MOS transistor, preferably an NMOS transistor.

9. An LC oscillator according to claim 1, wherein the first and/or the second capacitor is a variable capacitor.

10. An LC oscillator according to claim 1, wherein the resonance circuit is directly coupled to ground.

11. An integrated circuit, comprising an LC oscillator according to claim 1.

12. A device comprising an LC oscillator for producing an oscillator signal, the oscillator comprising:
- a resonance circuit comprising a first and a second capacitor and a first and a second inductance for determining the frequency of the oscillator signal, and
- an active circuit comprising a first and a second PMOS transistor for amplifying the oscillator signal, the gate of each said transistor being directly coupled to the drain of the other transistor so as to provide a directly cross-coupled transistor pair,
- wherein the active circuit is coupled to the resonance circuit, characterized in that the oscillator further comprises a first and a second auxiliary transistor circuit for further amplifying the oscillator signal, each said auxiliary transistor circuit having an input terminal capacitively coupled to the drain of the first and second PMOS transistor respectively.

13. A device according to claim 12 which is a television or telecommunications device.

* * * * *